(12) United States Patent
Yang et al.

(10) Patent No.: US 12,414,309 B2
(45) Date of Patent: Sep. 9, 2025

(54) MEMORY DEVICE INCLUDING PHASE-CHANGE MATERIAL

(71) Applicant: Samsung Electronics Co., Ltd., Suwon-si (KR)

(72) Inventors: Kiyeon Yang, Suwon-si (KR); Changseung Lee, Suwon-si (KR); Dongho Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 362 days.

(21) Appl. No.: 18/150,123

(22) Filed: Jan. 4, 2023

(65) Prior Publication Data

US 2023/0380195 A1 Nov. 23, 2023

(30) Foreign Application Priority Data

May 20, 2022 (KR) .......................... 10-2022-0062346

(51) Int. Cl.
*H10B 63/00* (2023.01)
*H10B 63/10* (2023.01)

(52) U.S. Cl.
CPC ........... *H10B 63/845* (2023.02); *H10B 63/10* (2023.02); *H10B 63/24* (2023.02)

(58) Field of Classification Search
None
See application file for complete search history.

(56) References Cited

U.S. PATENT DOCUMENTS

| 5,166,758 A | 11/1992 | Ovshinsky et al. |
| 7,864,567 B2 | 1/2011 | Gordon et al. |

(Continued)

FOREIGN PATENT DOCUMENTS

| CN | 103794723 A | 5/2014 |
| CN | 112652714 A | 4/2021 |

(Continued)

OTHER PUBLICATIONS

Wonjun Yang et al., "Heterogeneously structured phase-change materials and memory," Journal of Applied physics, 129, 050903, Feb. 5, 2021.

(Continued)

*Primary Examiner* — Michelle Mandala
(74) *Attorney, Agent, or Firm* — Harness, Dickey & Pierce, P.L.C.

(57) ABSTRACT

A memory device including a phase-change material includes: a substrate; a first memory cell including a first selection layer and a first phase-change material layer, and a second memory cell including a second selection layer and a second phase-change material layer, wherein the first memory cell and the second memory cell are arranged apart from each other with an insulating layer therebetween in a normal direction of the substrate, wherein the first phase-change material layer and the second phase-change material layer include: a first layer including a thermal confinement material; and a second layer including a phase-change material, respectively, wherein the first layer and the second layer extend in a direction vertical to the substrate, and wherein the first phase-change material layer is physically isolated from the second phase-change material layer by the insulating layer.

26 Claims, 12 Drawing Sheets

(56) References Cited

U.S. PATENT DOCUMENTS

| | | | |
|---|---|---|---|
| 8,513,640 | B2 | 8/2013 | Morikawa et al. |
| 9,129,673 | B2 | 9/2015 | Tominaga et al. |
| 9,384,829 | B2 | 7/2016 | Furuhashi et al. |
| 9,543,513 | B2 | 1/2017 | Kim et al. |
| 9,704,921 | B2 | 7/2017 | Kim et al. |
| 9,748,311 | B2 | 8/2017 | Fantini et al. |
| 10,163,977 | B1 | 12/2018 | Fantini et al. |
| 10,186,552 | B2 | 1/2019 | Choi et al. |
| 2011/0049457 | A1 | 3/2011 | Kang et al. |
| 2017/0237000 | A1 | 8/2017 | Terai et al. |
| 2019/0148456 | A1 | 5/2019 | Wu et al. |
| 2020/0006432 | A1* | 1/2020 | Grobis ............... H10N 50/01 |
| 2022/0190029 | A1* | 6/2022 | Kau .................. H10N 70/066 |

FOREIGN PATENT DOCUMENTS

| KR | 10-2009-0093393 A | 9/2009 |
|---|---|---|
| KR | 10-1532874 B1 | 7/2015 |
| KR | 10-1653569 B1 | 9/2016 |

OTHER PUBLICATIONS

Keyuan Ding et al., "Phase-change heterostructure enables ultralow noise and drift for memory operation," Science 366, pp. 210-215, Oct. 11, 2019.

\* cited by examiner

MEMORY DEVICE INCLUDING PHASE-CHANGE MATERIAL

CROSS-REFERENCE TO RELATED APPLICATION

This application is based on and claims priority under 35 U.S.C. § 119 to Korean Patent Application No. 10-2022-0062346, filed on May 20, 2022 in the Korean Intellectual Property Office, the disclosure of which is incorporated by reference herein in its entirety.

BACKGROUND

1. Field

The disclosure relates to a memory device including a phase-change material.

2. Description of the Related Art

Recently, with the demand for miniaturization and high performance of electronic devices increasing, the demand for a memory device configured to store information in various electronic devices, such as computers and portable communication devices, is also increasing. The memory device includes a memory device, such as a phase-change random-access memory (PRAM) capable of storing data by using a characteristic of switching between different resistance states according to an applied voltage or current. PRAM has improved scaling potential compared to memory techniques in the related art. However, when PRAM is manufactured by depositing a phase-change material in a horizontal direction, with respect to a substrate, there may be a limit in improving memory capacity.

SUMMARY

Provided is a memory device including a phase-change material with improved memory capacity together with fast driving and low power consumption.

Additional aspects will be set forth in part in the description which follows and, in part, will be apparent from the description, or may be learned by practice of the presented embodiments of the disclosure.

According to an embodiment, a memory device includes: a substrate; a first memory cell extending in a first direction in parallel with an upper surface of the substrate, the first memory cell including a first selection layer and a first phase-change material layer, which are electrically connected to each other; a second memory cell extending in the first direction, the second memory cell including a second selection layer and a second phase-change material layer, which are electrically connected to each other; and an insulating layer isolating the first memory cell from the second memory in a second direction normal to the upper surface of the substrate such that the first phase-change material layer is physically isolated from the second phase-change material layer by the insulating layer, wherein the first phase-change material layer and the second phase-change material layer each comprise at least one first layer including a thermal confinement material and at least one second layer including a phase-change material, and wherein the first layer and the second layer extend in the second direction.

According to an embodiment, in the memory device, the thermal constraint material includes $Ti_xTe_{1-x}(0.3 \leq x \leq 0.7)$.

According to an embodiment, in the memory device, the phase-change material includes at least one of a Ge—Sb—Te (GST) alloy, a doped-GST alloy, an $Sb_yTe_{1-y}(0.2 \leq y \leq 0.8)$, or doped-$Sb_yTe_{1-y}(0.2 \leq y \leq 0.8)$.

According to an embodiment, in the memory device, the first phase-change material layer and the second phase-change material layer are electrically insulated by the insulating layer.

According to an embodiment, in the memory device, at least one of the first phase-change material layer or the second phase-change material layer comprises a plurality of first layers and a plurality of second layers which alternate in the first direction such that each of the second layers is between two adjacent first layers.

According to an embodiment, in the memory device, the at least one first layer including the thermal confinement material and the at least one second layer including the phase-change material each independently have a thickness of about 1 nm to about 20 nm in the first direction.

According to an embodiment, in the memory device, each of the first phase-change material layer and the second phase-change material layer has a total thickness of about 10 nm to about 100 nm in the first direction.

According to an embodiment, in the memory device, a thickness of the insulating layer is about 5 nm to about 50 nm.

According to an embodiment, in the memory device, wherein at least one of the first memory cell or the second memory cell further comprises a heating electrode between the first or second selection layer and the corresponding first or second phase-change material layer.

According to an embodiment, in the memory device, at least one of the first selection layer or second selection layer comprises a material having an ovonic threshold switching characteristic.

According to an embodiment, the at least one of the first selection layer or the second selection layer comprises at least one first element selected from germanium (Ge) and tin (Sn), a second element including one or more selected from arsenic (As), antimony (Sb), and/or bismuth (Bi), and a third element including one or more selected from sulfur (S), selenium (Se), and/or tellurium (Te).

According to an embodiment, the memory device further includes a first electrode electrically connected to one of the first selection layer and the second selection layer.

According to an embodiment, the memory device further includes a second electrode electrically connected to the first phase-change material layer and the second phase-change material layer, the second electrode extending in the second direction.

According to an embodiment, the first memory cell and the second memory cell share the second electrode as a common electrode.

According to an embodiment, a memory device includes: a substrate; a first insulating layer and a second insulating layer spaced apart from each other in a second direction normal to an upper surface of the substrate; and at least one memory cell between the first insulating layer and the second insulating layer, the at least one memory cell comprising a selection layer and a phase-change material layer, which are electrically connected to each other in a first direction parallel to the upper surface of the substrate, wherein the selection layer includes a recess portion and covers surfaces of the first insulating layer and the second insulating layer, wherein the phase-change material layer comprises at least one first layer including a thermal confinement material; and at least one second layer including a phase-change material, and wherein the phase-change material layer covers at least of a portion of the first insulating layer, the selection layer, and the second insulating layer along the recess portion such that a length of a surface of the phase-change material layer adjacent to the first insulating layer is greater than a length of a surface of the phase-change material layer adjacent to the selection layer.

According to an embodiment, in the memory device, the thermal confinement material may include $Ti_xTe_{1-x}$ (0.3≤x≤0.7).

According to an embodiment, in the memory device, the phase-change material may include at least one of a Ge—Sb—Te (GST) alloy, a doped-GST alloy, an $Sb_yTe_{1-y}$ (0.2≤y≤0.8), or doped-$Sb_yTe_{1-y}$(0.2≤y≤0.8).

According to an embodiment, in the memory device, the at least one first layer and the at least one second layer include a plurality of first layers and a plurality of second layers which alternate in the first direction such that each of the second layers is between two adjacent first layers.

According to an embodiment, in the memory device, a length of a surface of the phase-change material layer adjacent to the first insulating layer is greater than about 1.0 times and equal to or less than about 5.0 times a length of a surface of the phase-change material layer adjacent to the selection layer.

According to an embodiment, in the phase-change material layer, the length of the surface adjacent to the first insulating layer is greater than about 1.0 times and less than or equal to about 5.0 times the length of the surface adjacent to the selection layer.

According to an embodiment, in the memory device, each of the first layer and the second layer independently has a thickness of about 1 nm to about 20 nm in the first direction.

According to an embodiment, in the memory device, the phase-change material layer has a thickness of about 10 nm to about 100 nm in the first direction.

According to an embodiment, in the memory device, each of the first insulating layer and the second insulating layer has a thickness of about 5 nm to about 50 nm in the second direction.

According to an embodiment, in the memory device, the selection layer includes a material having an ovonic threshold switching characteristic.

According to an embodiment, the memory device further includes a first electrode electrically connected to the selection layer and a second electrode electrically connected to the phase-change material layer.

According to an embodiment, the memory device incudes a plurality of memory cells, and the plurality of memory cells share the second electrode as a common electrode.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
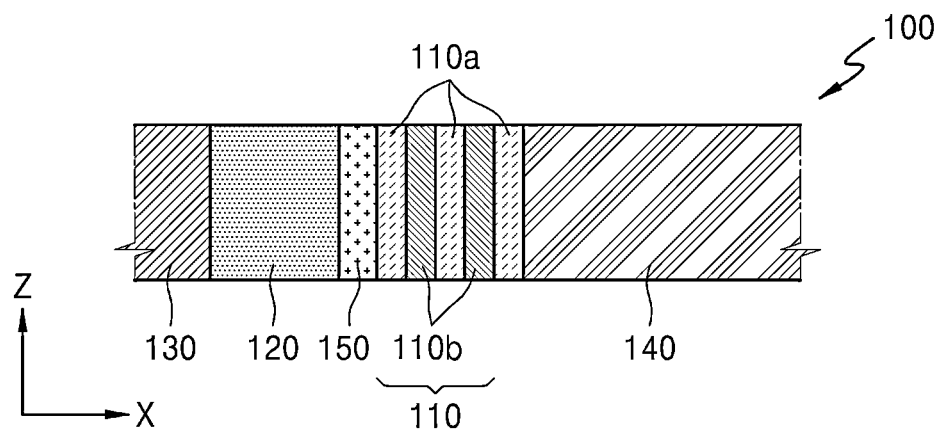
FIG. 1 is a cross-sectional view of a memory cell according to at least one embodiment.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, the term "on" or "above" may include not only one directly above another in contact but also one directly above another without contact. Singular expressions include plural expressions unless they are explicitly and differently specified in context. In addition, when a portion "includes" a component, this means that it may further include other components without excluding other components unless otherwise described. It will be understood that when a component is referred to as being "on" another component or on an "upper portion" of another component, the component can be directly on the other component or over the other component in a non-contact manner. It will be understood that the spatially relative terms are intended to encompass different orientations of the device in use or operation in addition to the orientation depicted in the figures. For example, if the device in the figures is otherwise oriented (e.g., rotated 90 degrees or at other orientations), the spatially relative descriptors used herein are to be interpreted accordingly.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

The use of the term "the" and similar indicative terms may correspond to both singular and plural. When there is no explicit description or contrary description of the order of the operations constituting a method, these operations may be performed in an appropriate order, and may not be necessarily limited to the described order.

Connections or connection members of lines between components illustrated in the drawings exemplarily represent functional connection and/or physical or circuitry connections, and the actual device may be implemented by replaceable or additional various functional connections, physical connections, or circuitry connections.

The use of all examples or exemplary terms is simply for describing a technical idea in detail, and the scope of the present disclosure is not limited by these examples or exemplary terms unless limited by the claims.

Hereinafter, a memory device including a phase-change material will be described in detail with reference to the accompanying drawings. Like reference numerals in the drawings denote like components, and sizes of components in the drawings may be exaggerated for convenience of explanation. In addition, embodiments to be described below are only exemplary and various modifications from such embodiments may be possible.

FIG. 1 is a cross-sectional view of a memory cell 100 according to at least one embodiment.

Referring to FIG. 1, the memory cell 100 may include a phase-change material layer 110, a selection layer 120, a first electrode 130, a second electrode 140, and a third electrode 150. The phase-change material layer 110 may be electrically connected between the second electrode 140 and the third electrode 150. The selection layer 120 may be electrically connected between the first electrode 130 and the third electrode 150. The memory cell 100 may include the third electrode 150 between the selection layer 120 and the phase-change material layer 110. The first electrode 130, the selection layer 120, the third electrode 150, the phase-change material layer 110, and the second electrode 140 of the memory cell 100 may be sequentially arranged in a third direction (X direction) in parallel with an upper surface of a substrate 260 illustrated in FIG. 2A.

The phase-change material layer 110 may include a plurality of first layers 110a and a plurality of second layers 110b. The first layer 110a and the second layer 110b may extend in a second direction (Z direction) perpendicular to the upper surface of the substrate 260 illustrated in FIG. 2A and may be alternately arranged one or more times in the third direction (X direction). Inner and outer (e.g., the left and right) side surfaces of the phase-change material layer 110 may include the first layers 110a, and each of the second layers 110b may be arranged between two adjacent first layers 110a. The number of repetitive arrangements of the first layers 110a and the second layers 110b may be, for example, 2 to 200. The phase-change material layer 110 may have a thickness of, for example, about 10 nm to about 100 nm in the third direction (X direction) in parallel with the upper surface of the substrate 260 illustrated in FIG. 2A. The phase-change material layer 110 may be configured to switch between electrically connecting and electrically isolating the second electrode 140 and the third electrode 150, based on the phase of the phase-change material layer.

The first layer 110a may act as a thermal confinement layer. The first layer 110a may act as a thermal confinement layer and reduce an effective volume of the phase-change material of the second layer 110b. For example, first layer 110a may act as a thermal confinement layer and promote crystallization of the phase-change material of the second layer 110b. In at least one embodiment, the first layer 110a may block heat dissipation to localize heating, and thus, may increase a phase-change speed of the phase-change material of the second layer 110b and enable a stable driving of a semiconductor device. The first layer 110a may include, for example, a thermal confinement material, such as $Ti_xTe_{1-x}$ ($0.3 \leq x \leq 0.7$).

The second layer 110b may act as a phase-change layer. The second layer 110b may be thermally confined by the first layer 110a, and thus, may reduce power consumption of the semiconductor device due to the localized energy. The second layer 110b may include, for example, a phase-change material (PCM) selected from, e.g., at least one of a Ge—Sb—Te (GST) alloy, a doped-GST alloy, a $Sb_yTe_{1-y}$ ($0.2 \leq y \leq 0.8$), a doped-$Sb_yTe_{1-y}$ ($0.2 \leq x \leq 0.8$), and/or the like. In at least one embodiment, the second layer 110b may further include a dopant material including Sc and/or Ti.

The first layer 110a and the second layer 110b may each independently have a thickness of, for example, about 1 nm to about 20 nm in the third direction (X direction).

The selection layer 120 may include a material resistance of which may change according to a magnitude of a voltage applied to both ends thereof. For example, the selection layer 120 may also include a p-n junction, mixed ion-electron conductors (MIEC), a Mott transition device, and/or the like.

In at least one embodiment, the selection layer 120 may include a chalcogenide material having an ovonic threshold switching (OTS) characteristic. For example, the selection layer 120 may include a first element including germanium (Ge) and/or tin (Sn), a second element including arsenic (As), antimony (Sb), and/or bismuth (Bi), and a third element including sulfur (S), selenium (Se), and/or tellurium (Te).

The selection layer 120 may be (or include) a diode. For example, the selection layer 120 may include a p-n junction diode and/or a Schottky diode. The diode may have a bonded structure, in which materials of different conductivity types extend in the third direction (X direction) in parallel with an upper surface of a substrate 260 illustrated in FIG. 2A, and which are arranged side by side. For example, the diode may have an n-type conductivity and a p-type conductivity, and one of the n-type and p-type conductive types may be arranged adjacent to the first electrode 130, while the other may be arranged adjacent to the phase-change material layer 110, the third electrode 150, and/or the second electrode 140. The selection layer 120 may include, in at least one embodiment, a silicon diode, in which p-Si and n-Si are bonded to each other. Alternatively, the selection layer 120 may include an oxide diode, in which p-NiOx is bonded to n-TiOx and/or in which p-CuOx is bonded to n-TiOx.

The selection layer 120 may be formed using deposition, for example, chemical deposition. For example, the selection layer 120 may be formed by using a chemical vapor deposition (CVD) process or an atomic layer deposition (ALD) process using a plurality of sources including a chalcogenide material. The selection layer 120 may also be formed to have a small thickness by a co-sputtering deposition process. For example, the thickness of the selection layer 120 may be about 5 nm to about 50 nm, and/or about 5 nm to about 30 nm.

The first electrode 130 may be electrically connected to the selection layer 120, the second electrode 140 may be electrically connected to the phase-change material layer 110, and/or the third electrode 150 may be between the selection layer 120 and the phase-change material layer 110. The selection layer 120 may be electrically connected to the phase-change material layer 110 via the third electrode 150.

The first electrode 130, the second electrode 140, and the third electrode 150 may make a path, through which current flows. For example, when a voltage greater than a threshold voltage is applied between the first electrode 130 and the second electrode 140, the selection layer 120 may be in a low resistance state so that a current starts to flow, and when a voltage less than the threshold voltage is applied between the first electrode 130 and the second electrode 140, the selection layer 120 may go back to a high resistance state and a current may seldom flow. In addition, when the current flowing through the selection layer 120 becomes less than a holding current, the selection layer 120 may be considered to be in a high resistance state. Accordingly, the memory cell 100 may be turned on/off according to a voltage applied between the first electrode 130 and the second electrode 140.

The first electrode 130 and the second electrode 140 may include a conductive material. For example, a conductive material may include a metal, a conductive metal oxide, a conductive metal nitride, a combination thereof, and/or the like. For example, the conductive material may include at least one of a carbon (C), titanium nitride (TiN), titanium silicon nitride (TiSiN), titanium carbon nitride (TiCN), titanium aluminum nitride (TiAlN), titanium silicon nitride (TiSiN), tantalum (Ta), tantalum nitride (TaN), tungsten (W), tungsten nitride (WN), and/or the like.

The third electrode 150 may also function as a heating electrode (or a resistor element). The third electrode 150 may heat the memory cell 100 in an operation of writing a state thereof from a high resistance state '0' to a low resistance state '1', or to the contrary, writing a state thereof from a low resistance state '1' to a high resistance state '0'. For example, a writing operation may include heating the phase-change material layer 110 to induce a phase change in the phase-change material layer 110. In at least one embodiment, the memory cell 100 may be supplied with a relatively high amplitude current such that the third electrode 150 heats to a first temperature and the second layer 110b maintains or phase changes to an amorphous phase during a reset operation; supplied with a relatively moderate amplitude current such that the third electrode 150 heats to a second temperature (lower than the first) and the second layer 110b maintains or phases changes to an crystalline phase during a set operation; and/or supplied with a relatively low amplitude current during a read operation.

The third electrode 150 may be formed of the same conductive material as the first electrode 130 and/or the second electrode 140, or may include at least one of tantalum silicon nitride (TaSiN), tantalum aluminum nitride (TaAlN), tungsten silicide (WSi), titanium tungsten (TiW), molybdenum nitride (MoN), niobium nitride (NbN), titanium boron nitride (TiBN), zirconium silicon nitride (ZrSiN), tungsten silicon nitride (WsiN), tungsten boron nitride (WBN), zirconium aluminum nitride (ZrAlN), molybdenum aluminum nitride (MoAlN), titanium aluminum (TiAl), titanium oxygen nitride (TiON), titanium aluminum oxygen nitride (TiAlON), tungsten oxygen nitride (WON), tantalum oxygen nitride (TaON), silicon carbon (SiC), silicon carbon nitride (SiCN), carbon nitride (CN), tantalum carbon nitride (TaCN), a high melting point metal, which is a combination thereof, and/or a nitride thereof, but is not limited thereto. For example, in at least one embodiment, the memory cell 100 may be connected (e.g., through a word line) to at least one current source including, e.g., a current control circuit configured to control the timing and/or amplitude of a current supplied to the memory cell based on instructions received, e.g., from a processor and/or a user.

Figure 2A:
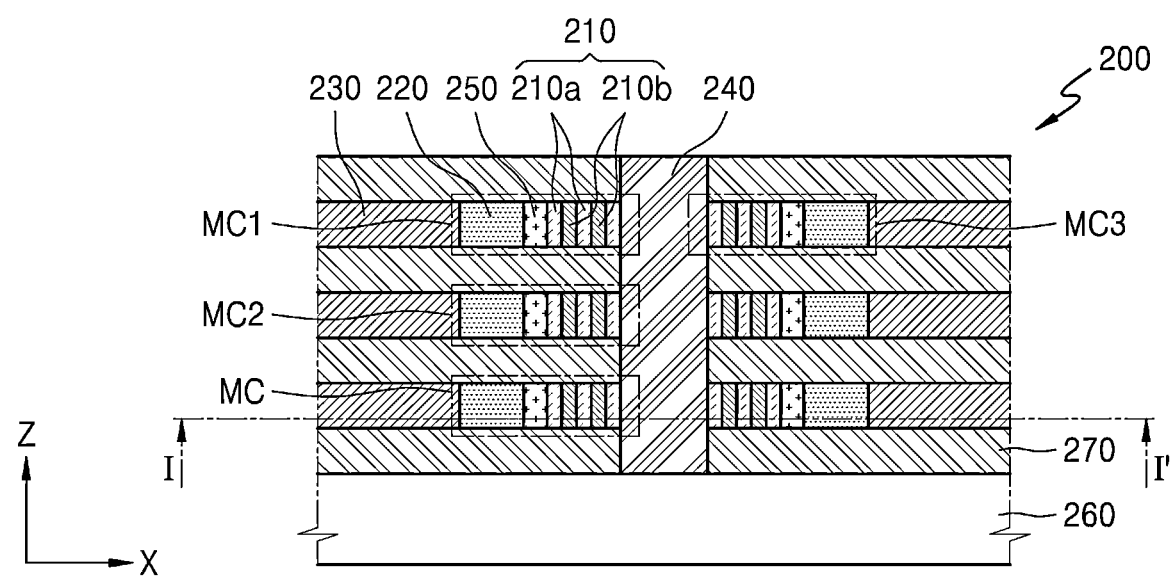
FIG. 2A is a cross-sectional view of a memory device according to at least one embodiment.

FIG. 2A is a cross-sectional view of a memory cell 200 according to at least one embodiment.

Referring to FIG. 2A, the memory device 200 may include a plurality of memory cells MC including a phase-change material layer 210 and a selection layer 220, a substrate 260, and an insulating layer 270 separating the plurality of memory cells MC.

Among the plurality of memory cells MC, a first memory cell MC1 and a second memory cell MC2 adjacent to each other in a normal direction of the substrate 260 may be apart from each other in the normal direction of the substrate 260 with the insulating layer 270 therebetween. Each of the phase-change material layer 210 and the selection layer 220 may extend in the third direction (X direction) in parallel with the substrate 260 and may be arranged side by side. The insulating layer 270 may be formed on a portion in contact with the memory cell MC. An upper surface or a lower surface of the insulating layer 270 may be in contact with the memory cell MC. The insulating layer 270 may be in contact with a lower surface of the first memory cell MC1 and an upper surface of the second memory cell MC2.

The phase-change material layer 210 may include a first layer 210a and a second layer 210b extending in the second direction (Z direction) vertical to the substrate 260. The first layer 210a and the second layer 210b may be the same as and/or substantially similar to the first layer 110a and the second layer 110b described with reference to FIG. 1, respectively.

The phase-change material layer 210 may have an electron carrier path therein based on the phase of the phase-change material layer 210. The phase-change material layers 210 of the plurality of memory cells MC may be physically separated from each other by the insulating layer 270 and electrically insulated from each other, and thus, electron transfer between the phase-change material layers 210 between adjacent memory cells MC may be reduced and crosstalk may be reduced.

The selection layer 220 may be formed on a portion in contact with the first electrode 230. The selection layer 220 may be the same as and/or substantially similar to the selection layer 120 described with reference to FIG. 1.

The first electrode 230 may extend in parallel with the substrate 200 in the third direction (X direction) in parallel with the substrate 200, and the first electrode 230 may be arranged between the two insulating layers 270. A second electrode 240 may extend in a direction normal to the upper surface of the substrate 200. In addition, the second electrode 240 may be a common electrode of the plurality of memory cells MC. In addition, both of first and third memory cells MC1 and MC3 may have a structure connected in a circular shape around the second electrode 240. A third electrode 250 may be arranged between the selection layer 220 and the phase-change material layer 210. The first electrode 230, the second electrode 240, and the third electrode 250 may be the same as the first electrode 130, the second electrode 140, and the third electrode 150 described with reference to FIG. 1, respectively.

The substrate 260 may include a semiconductor material, such as silicon (Si), germanium (Ge), silicon germanium (SiGe), silicon carbide (SiC), gallium arsenide (GaAs), indium arsenide (InAs), and indium phosphide (InP), and may also include an insulating material, such as silicon oxide, silicon nitride, and silicon oxynitride.

The insulating layer 270 may include an oxide (such as silicon oxide), a nitride (such as silicon nitride), a combination thereof, and/or the like. A thickness of the insulating layer 270 may be about 5 nm to about 50 nm.

Figure 2B:
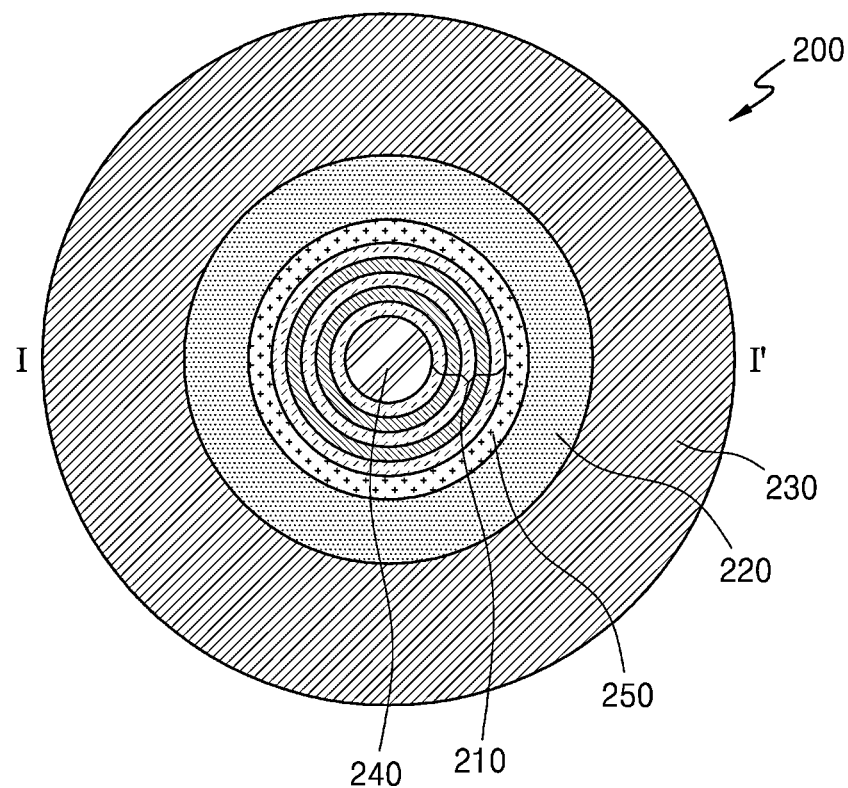
FIG. 2B is a cross-sectional view taken along line I-I' in FIG. 2A.

FIG. 2B is a cross-sectional view taken along line I-I' in FIG. 2A.

Referring to FIG. 2B, the second electrode 240 may be at the center of the memory device 200, and the phase-change material layer 210, the third electrode 250, the selection layer 220, and the first electrode 230 may be arranged in a direction away from the center of the memory device 200. In other words, the phase-change material layer 210, the third electrode 250, the selection layer 220, and the first electrode 230 may be arranged in a concentric circle shape around the second electrode 240. Accordingly, the first memory cell MC1 and the third memory cell MC3 in FIG. 2A may have a structure, in which the first memory cell MC1 are connected to the third memory cell MC3 in a circular shape with respect to the second electrode 240 as the center, and the first memory cell MC1 and the third memory cell MC3 may substantially form one memory cell.

The phase-change material layer 210, the selection layer 220, the first electrode 230, the second electrode 240, and the third electrode 250 may be the same as and/or substantially similar to the phase-change material layer 110, the selection layer 120, the first electrode 130, the second electrode 140, and the third electrode 150 described with reference to FIG. 1, respectively.

Figure 3A:
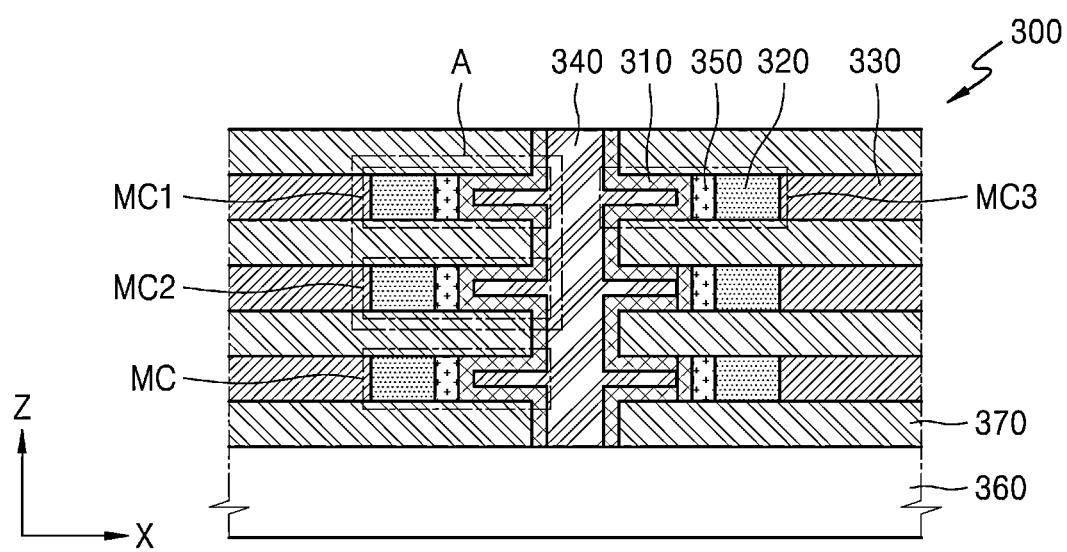
FIG. 3A is a cross-sectional view of a memory device according to another embodiment.
Figure 3B:
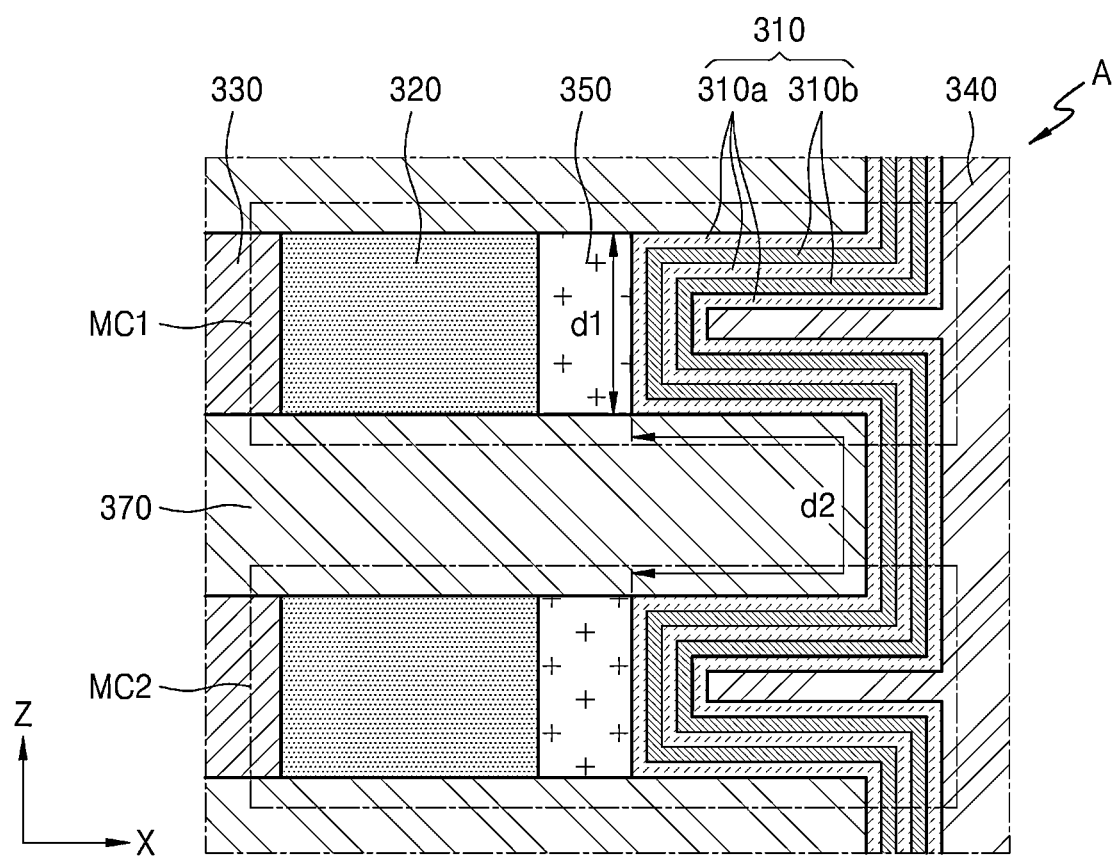
FIG. 3B is a schematic diagram illustrating an enlarged area A in FIG. 3A.

FIG. 3A is a cross-sectional view of a memory device 300 according to at least one embodiment, and FIG. 3B is a schematic diagram illustrating an enlarged region A in FIG. 3A.

The memory device 300 of FIG. 3A may be different from the memory device 200 described with reference to FIG. 2A in that a phase-change material layer 310 is arranged to cover an insulating layer 370 and a selection layer 320 along recess portions. The selection layer 320, a first electrode 330, a second electrode 340, and a third electrode 350 may otherwise be the same as and/or substantially similar to the selection layer 120, the first electrode 130, the second electrode 140, and the third electrode 150 described with reference to FIG. 1, respectively.

Referring to FIG. 3A, the memory device 300 may include a substrate 360, then insulating layers 370 arranged apart from each other in a normal direction of the substrate 360, and the memory cells MC arranged between the insulating layers 370, and the memory cells MC may include the selection layer 320 and the phase-change material layer 310.

Referring to FIG. 3B, the selection layer 320 may be arranged between the two insulating layers 370 to form the recess portion while covering a portion of surfaces of the two insulating layers 370. In other words, the insulating layer 370 may protrude from the selection layer 320 in the third direction (X direction) in parallel with an upper surface of the substrate 360, and the protruding portions of the two facing insulating layers 370 and sidewalls of the selection layer 320 may form the recess portion. The phase-change material layer 310 may be cover two insulating layers 370 and the selection layer 320 along the recess portion. For example, one phase-change material layer 310 may extend in a serpentine manner along sidewalls of a plurality of insulating layers 370, upper and lower surfaces of the plurality of insulating layers 370, and sidewalls of the plurality of selection layers 320. Likewise, a first layer 310a and a second layer 310b of the phase-change material layer 310 may extend in a serpentine manner along upper and lower surfaces of the plurality of insulating layers 370, and the sidewalls of the plurality of selection layers 320.

The phase-change material layer 310 may have a length d2 of a surface thereof adjacent to the insulating layer 370 greater than a length d1 of a surface thereof adjacent to the selection layer 320, and accordingly, an electron transfer path between adjacent first and second memory cells MC1 and MC2 may be lengthened, and thus, may reduce the potential for crosstalk between the first and second memory cells MC1 and MC2.

The length d1 of the surface of the phase-change material layer 310 adjacent to the selection layer 320 may be equal to a length of a sidewall of one selection layer 320 in the second direction (Z direction), that is vertical to the upper surface of the substrate 360. In addition, the length d1 of the surface of the phase-change material layer 310 adjacent to the selection layer 320 may be equal to a distance between two adjacent insulating layers 370. The length d2 of the surface of the phase-change material layer 310 adjacent to the insulating layer 370 may be equal to a sum of lengths of an upper surface, a sidewall, and a lower surface of one insulating layer 370 in contact with the phase-change material layer 310. For example, the length d2 of the phase-change material layer 310 adjacent to the insulating layer 370 may be greater than the length d1 of a surface of the phase-change material layer 310 adjacent to the selection layer 320 by greater than about 1.0 times, equal to or greater than about 1.5 times, equal to or greater than about 2.0 times, equal to or less than about 5.0 times, equal to or less than about 4.5 times, and/or equal to or less than about 4.0 times.

The first electrodes 330 of the plurality of memory cells MC may extend in parallel with each other in the third direction (X direction) in parallel with the substrate 360, and the first electrode 330 may be arranged between the two insulating layers 370. In addition, the second electrode 340 may extend in the second direction (Z direction) vertical to the substrate 360. In addition, a portion of the second electrode 340 may extend into the recess portion in the third direction (X direction) in parallel with the upper surface of the substrate 360. The third electrode 350 may be the same as the third electrode 150 described with reference to FIG. 1.

The substrate 360 and the insulating layer 370 may be the same as the substrate 260 and the insulating layer 270 described with reference to FIG. 2A, respectively.

From an aspect of driving the memory devices 200 and 300, the first electrodes 230 and 330 may be connected to one of a word line and a bit line, and the second electrodes 240 and 340 may be connected to the other thereof. The plurality of memory cells MC may include the second electrodes 240 and 340 as common electrodes. The second electrodes 240 and 340 may extend in the second direction (Z direction), that is vertical to the substrate 260, and may be commonly connected to the plurality of memory cells MC.

The memory devices 200 and 300, although not illustrated in the drawings, may further include an interlayer insulating layer on the substrates 260 and 360. The interlayer insulating layer may be arranged between the substrates 260 and 360 and the first electrodes 230 and 330, and/or between the substrates 260 and 360 and the second electrodes 240 and 340, respectively, to electrically isolate them. The interlayer insulating layer 270 may include an oxide, such as silicon oxide, a nitride, such as silicon nitride, or a combination thereof.

The memory devices 200 and 300, although not illustrated in the drawings, may further include an isolation insulating layer. The isolation insulating layer may contact the upper surfaces of the substrates 260 and 360 and may extend on the upper surfaces of the substrates 260 and 360 in the second direction (Z direction), that is vertical to the substrates 260 and 360. The isolation insulating layer may be formed to penetrate the first electrodes 230 and 330 and the insulating layers 270 and 370. The isolation insulating layer may extend along one side surface of the first electrodes 230 and 330 and may be between two first electrodes 230 and 330 arranged adjacent to the substrates 260 and 360 in the third direction (X direction) in parallel with the substrate 260 and 360, respectively.

The memory devices 200 and 300 may further include driving circuit regions on the substrates 260 and 360, although not illustrated in the drawings. The driving circuit region may include a circuit unit, such as a periphery circuit, a driving circuit, and/or a core circuit, that drives a memory cell or performs arithmetic processing. The circuit unit may include, for example, at least one of a page buffer, a latch circuit, a cache circuit, a column decoder, a sense amplifier, a data in/out circuit, a row decoder, etc. In addition, these circuits may be arranged between the substrates 260 and 360 and the memory cell MC. In other words, the driving circuit region and the memory cell MC may be sequentially arranged on the substrates 260 and 360, and this arrangement structure may be a cell on peri (COP) structure.

The driving circuit region may include one or more than two transistors and a wiring structure electrically connected to the transistors. The transistor may be arranged on an active region of a substrate defined by a device isolation layer. The transistor may include a gate, a gate insulator, and a source/drain. In addition, an insulating spacer may be arranged on both sidewalls of the gate, and an etching stop layer may be arranged on the gate and/or an insulating spacer. The etching stop layer may include an insulating material, such as silicon nitride and silicon oxynitride.

A wiring structure may be arranged in an appropriate number and arrangement, according to a layout of a driving circuit region, a type and arrangement of the gate, etc. The wiring structure may include a multilayer structure of two or more layers. The wiring structure may include contacts and wiring layers, which are electrically connected to each other, and the contacts and wiring layers may be sequentially stacked on the substrates 260 and 360. The contact and the wiring layer may each independently include a metal, conductive metal nitride, metal silicide, or a combination thereof, and may include a conductive material, such as tungsten, molybdenum, titanium, cobalt, tantalum, nickel, tungsten silicide, titanium silicide, cobalt silicide, tantalum silicide, and nickel silicide.

The wiring structure may include an interlayer insulating layer electrically isolating each component. The interlayer insulating layer may be arranged between a plurality of transistors, between a plurality of wiring layers, and/or between a plurality of contacts. The interlayer insulating layer may include silicon oxide, silicon nitride, silicon oxynitride, etc.

FIGS. 4A through 4D are cross-sectional views of portions of a fabricating process of the memory device 300 illustrated in FIGS. 3A and 3B, according to embodiments.

Figure 4A:
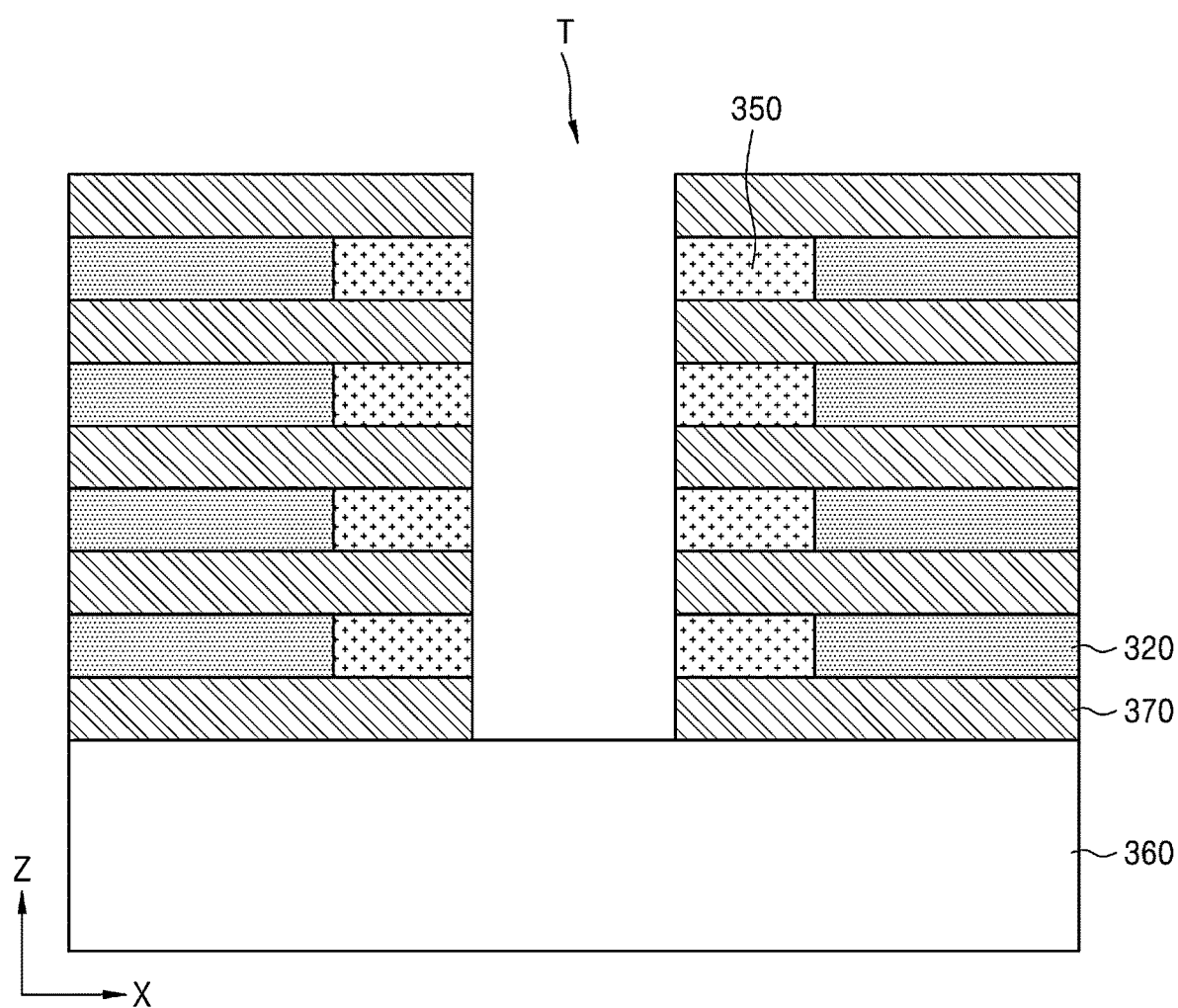
FIGS. 4A through 4D are cross-sectional views illustrating portions of a fabricating process of the memory device illustrated in FIGS. 3A and 3B, according to at least one embodiment.

Referring to FIG. 4A, the insulating layer 370, the selection layer 320, and the third electrode 350 may be alternately stacked on the substrate 360. The stack may also include the first electrode 230 (not illustrated) and/or the first electrode 230 may be added later. Then a vertical trench T may be formed in the second direction (Z direction) vertical to the substrate 360.

Figure 4B:
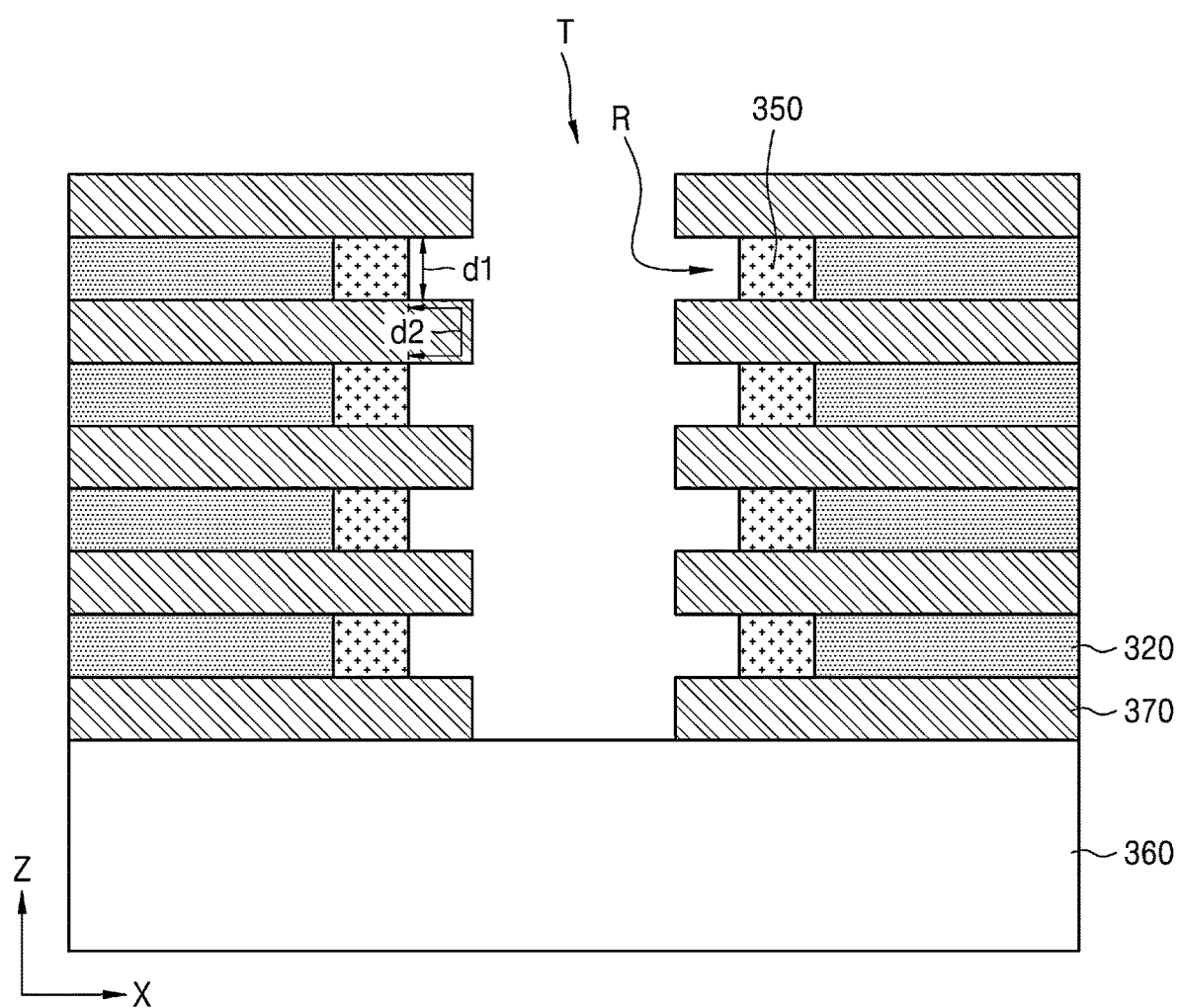

Referring to FIG. 4B, a portion of the third electrode 350 may be selectively removed to form a recess portion R in the third direction (X direction) in parallel with the substrate 360 between two insulating layers 370. The recess portion R may be formed to have the length d2 (e.g., that is a sum of lengths of a protruding upper surface, the sidewall, and the lower surface of the insulating layer 370) greater than the length d1 between the two insulating layers 370.

Figure 4C:
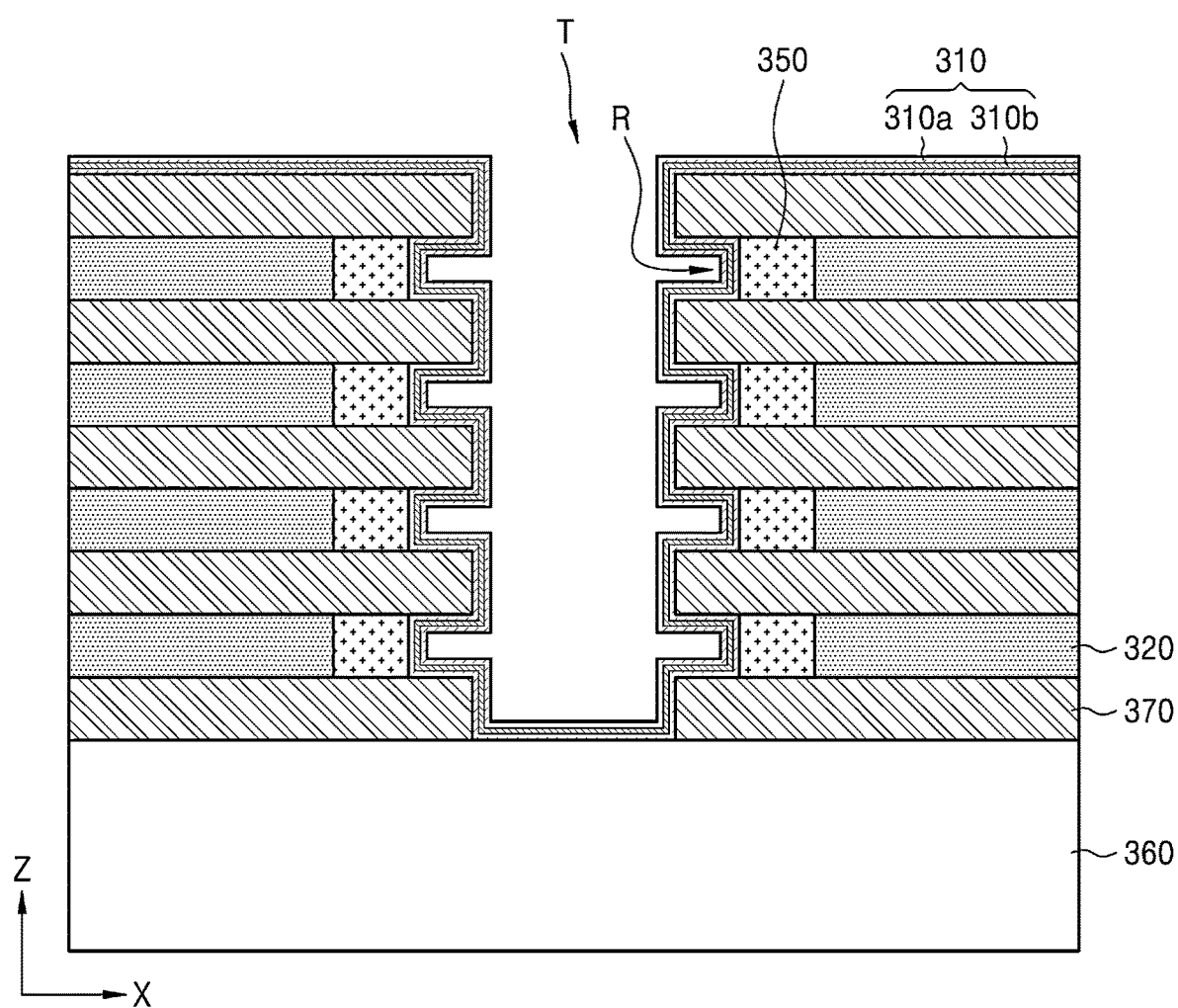

Referring to FIG. 4C, the phase-change material layer 310 may be formed along sidewalls of the vertical trench T. The phase-change material layer 310 may be formed by alternately stacking the first layer 310a and the second layer 310b. The phase-change material layer 310 may also be formed on the surface of the substrate 360.

Figure 4D:
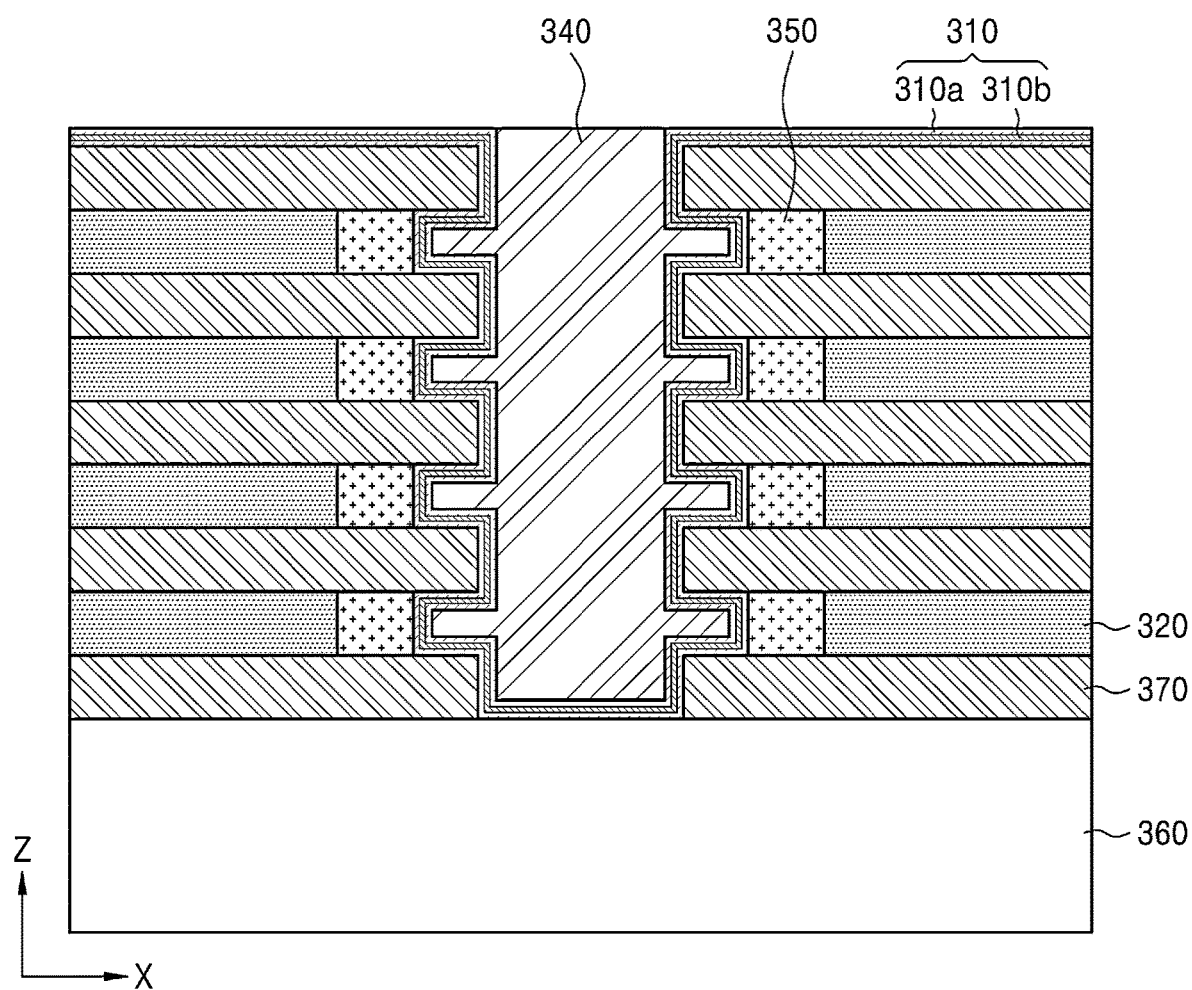

Referring to FIG. 4D, the second electrode 340 may be formed in the remaining space of the vertical trench T. In at least one embodiment, after the second electrode 340 is formed, an upper surface of the phase-change material layer 310 and/or the second electrode 340 may be mechanically and/or chemically removed in a planarization operation.

In the present disclosure, the phase-change material layer 310 may have the length d2 of a surface thereof adjacent to the insulating layer 370 greater than the length d1 of a surface thereof adjacent to the selection layer 320, and accordingly, an electron transfer path between adjacent first and second memory cells MC1 and MC2 may be lengthened, and thus, may reduce the potential for crosstalk.

FIGS. 5A through 5D are cross-sectional views illustrating portions of a fabricating process of the memory device 200 illustrated in FIGS. 2A and B, according to at least one embodiment.

In another embodiment of the present disclosure, operations in FIGS. 5A through 5D may be inserted after FIG. 4C.

Figure 5A:
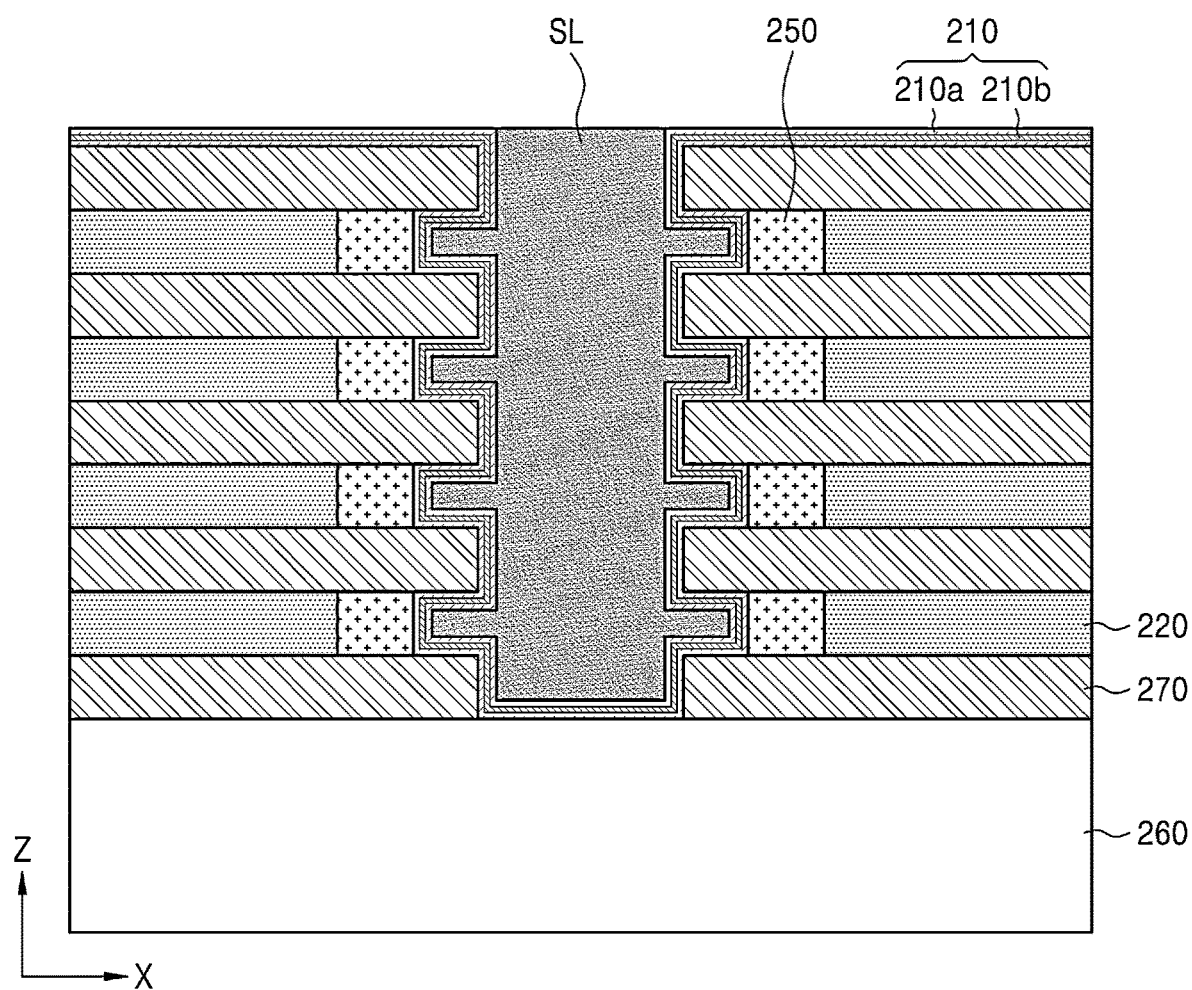
FIGS. 5A through 5D are cross-sectional views illustrating portions of a fabricating process of the memory device illustrated in FIG. 2, according to at least one embodiment.

Referring to FIG. 5A, a sacrificial layer SL may be formed in the remaining space of the vertical trench T.

Figure 5B:
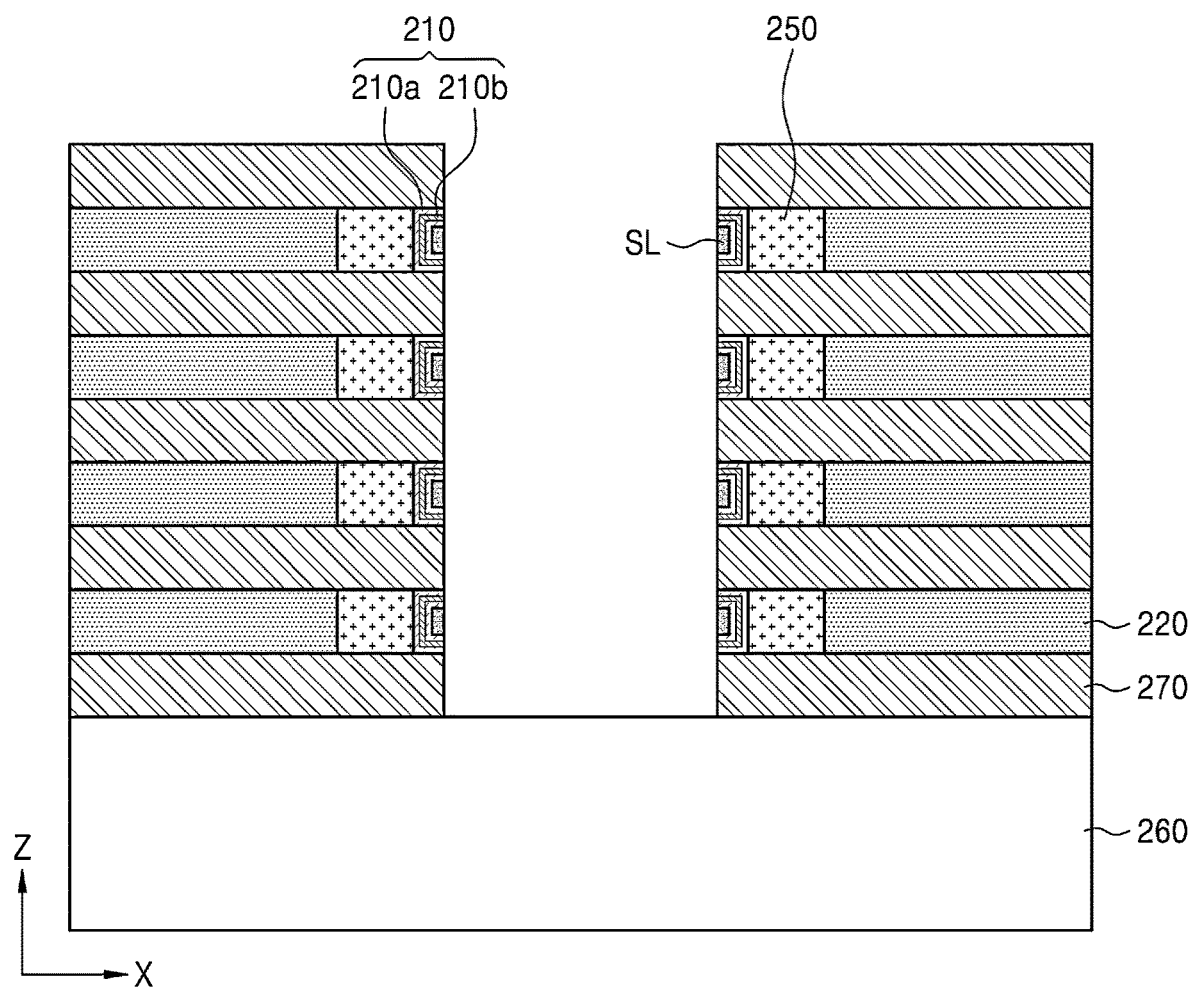

Referring to FIG. 5B, a portion of the sacrificial layer SL, a portion of the insulating layer 270, and a portion of the phase-change material layer 210 may be removed (etched) up to a length (in X direction), in which most of the phase-change material layer 210 covering the insulating layer 270 is removed.

Figure 5C:
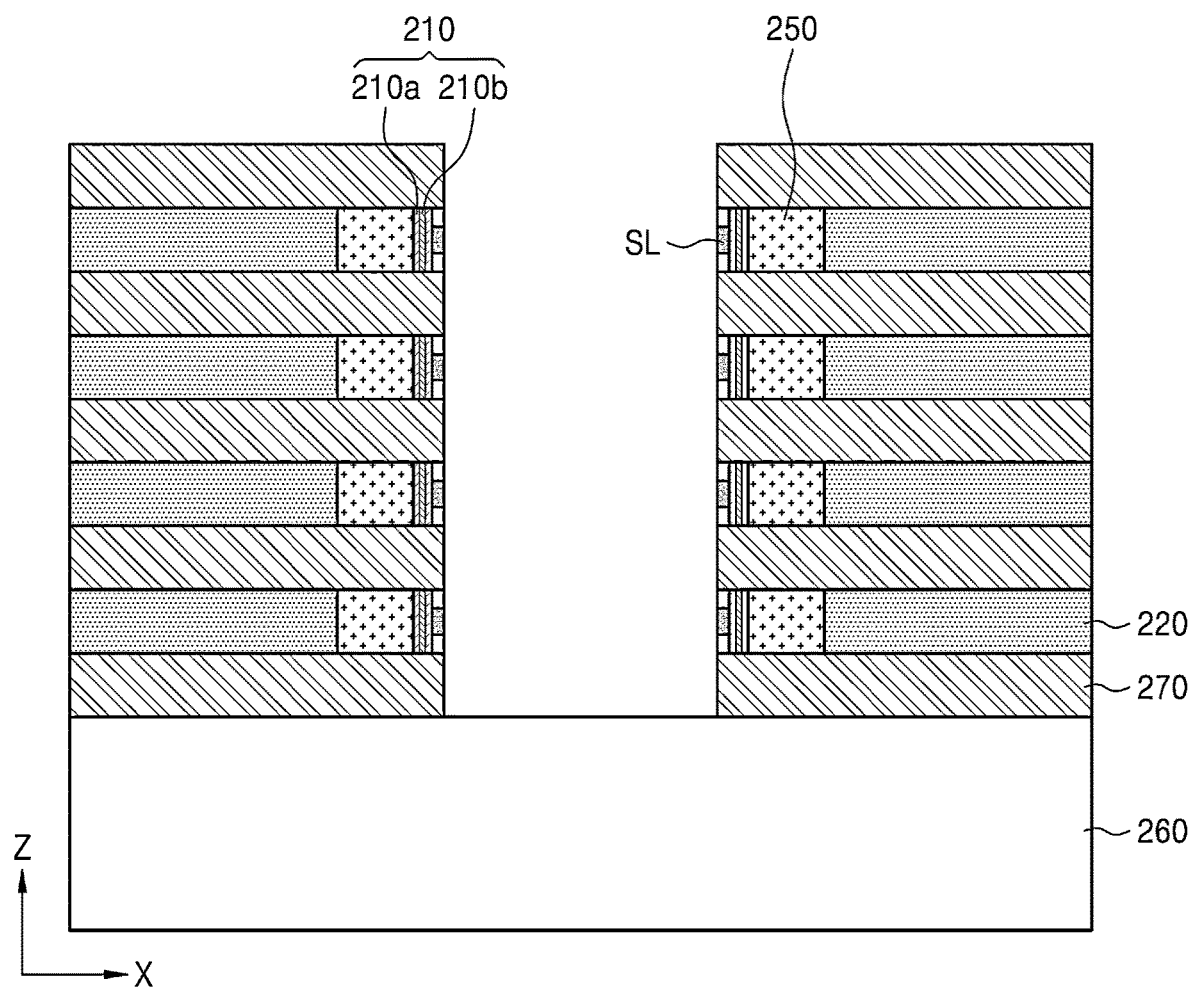

Referring to FIG. 5C, an exposed portion of the phase-change material layer 210 (e.g., a portion not being covered by the remaining portion of the sacrificial layer SL between two insulating layers 270) may be selectively removed.

Figure 5D:
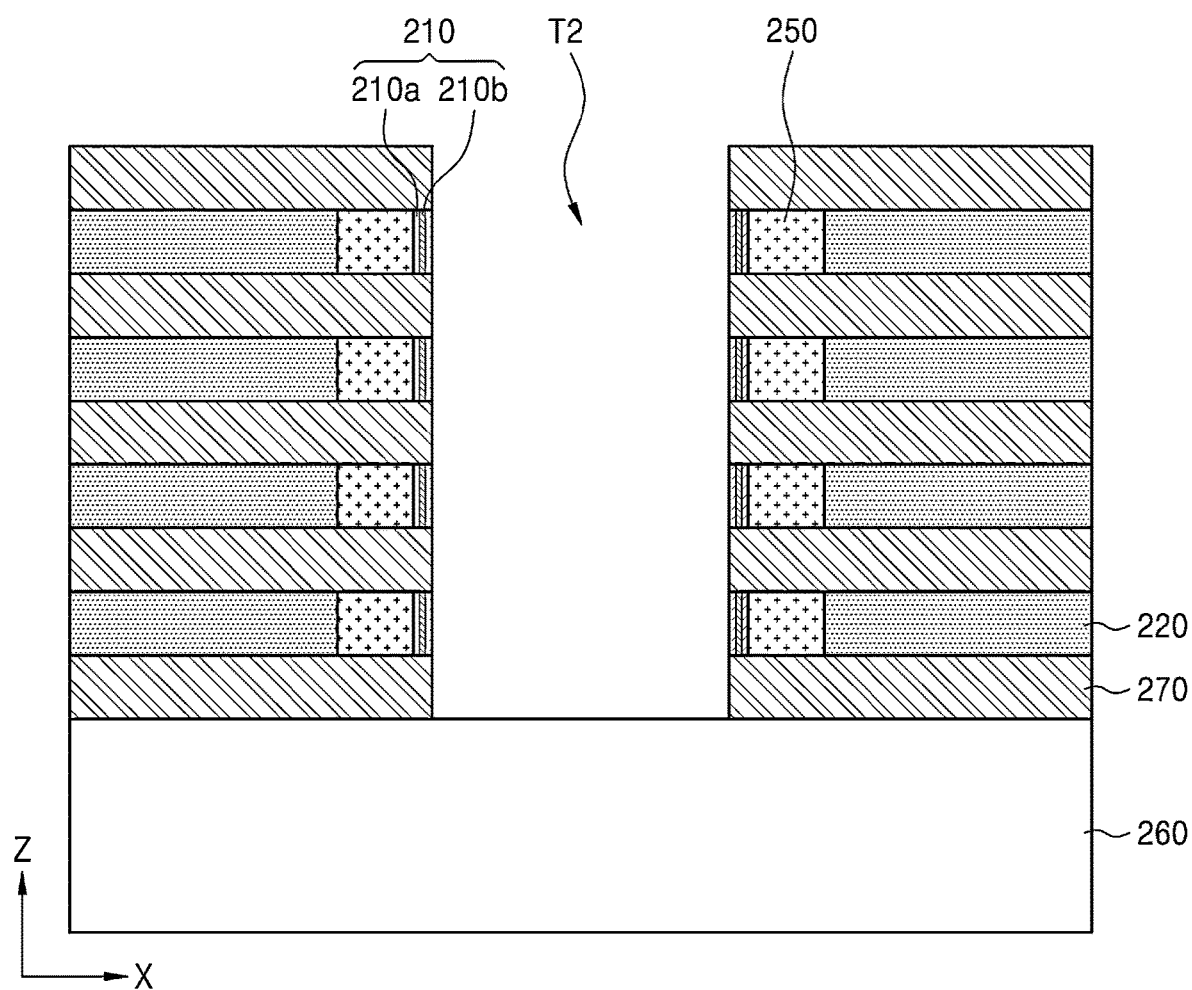

Referring to FIG. 5D, thereafter, the remaining portion of the sacrificial layer SL may be removed, and a vertical trench T2 greater than the vertical trench T in FIG. 4C may be formed. The vertical trench T2 formed in this manner may be filled with the second electrode 240.

In the present disclosure, the phase-change material layer 210 may be physically isolated and electrically insulated by the insulating layer 270, and accordingly, the crosstalk between adjacent memory cells MCs may be reduced.

Figure 6:
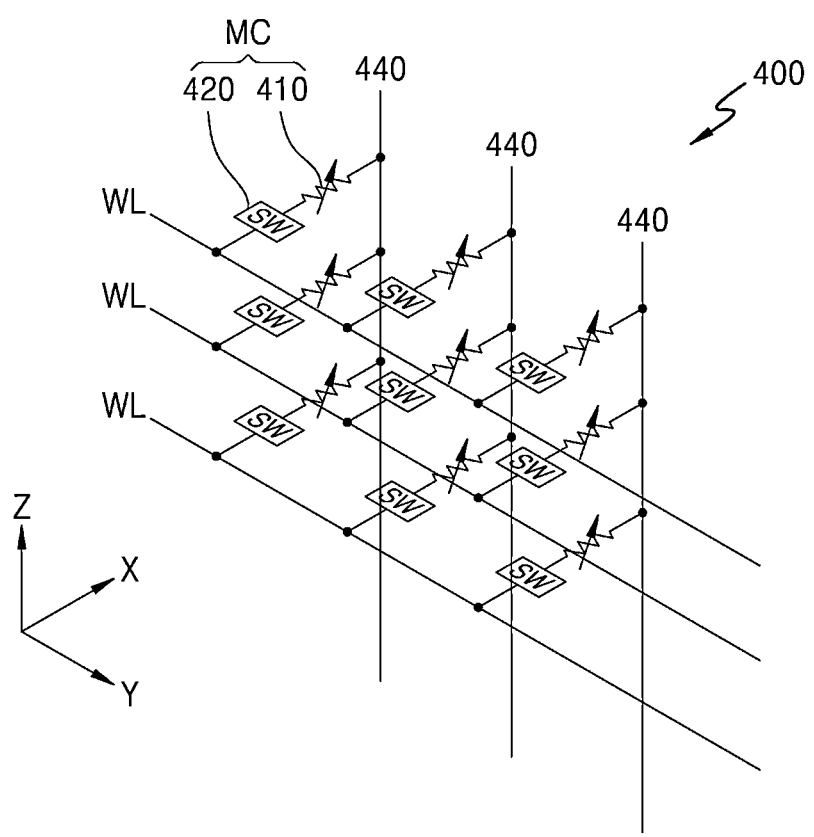
FIG. 6 illustrates an equivalent circuit of a memory device according to at least one embodiment.

FIG. 6 illustrates an equivalent circuit of a memory device 400 according to an embodiment.

Referring to FIG. 6, the memory device 400 may include a plurality of memory cells MC, and the memory device 400 may have a three-dimensional cross-point array structure. The memory device 400 may include a first electrode and a second electrode 440 at different levels. The memory device 400 may include the plurality of word lines WL extending in a first direction (Y direction) and apart from each other in the second direction (Z direction) vertical to the first direction (Y direction). In addition, the memory device 400 may include a plurality of second electrodes 440 apart from the first electrode in the third direction (X direction) and extending in parallel with each other in the second direction (Z direction). In addition, the memory device 400 may include a plurality of first electrodes (not illustrated) between the word line WL and the memory cell MC. In addition, the plurality of second electrodes 440 may be connected to a plurality of bit lines (not illustrated). However, the arrangement of the word line WL and the bit line is not limited thereto. For example, positions of the word line WL and the bit line may be changed. In other words, the first electrode may be connected to one of the word line WL and the bit line, and the second electrode 440 may be connected to the other.

The memory cell MC may be arranged between the first electrode and the second electrode 440. The memory cell MC may be electrically connected to the first electrode and the second electrode 440 and may be arranged at an intersection thereof. The memory cells MC may be arranged in a matrix form. The memory cell MC may include a phase-change material layer 410 for storing information and a selection layer 420 for selecting the memory cell MC. Various voltage signals or current signals may be provided via the first electrode and the second electrode 440, and accordingly, data may be written to or read from selected memory cells MC, while write or read operations on other unselected memory cells MC are prevented.

The memory cells MC may be arranged in the same structure in the second direction (Z direction). For example, in the memory cell MC arranged between the first electrode and the second electrode 440, the phase-change material layer 410 may be electrically connected to the second electrode 440, the selection layer 420 may be electrically connected to the first electrode, and the phase-change material layer 410 may be connected to the selection layer 420 in series, but the embodiments is not limited thereto. For example, unlike as illustrated in FIG. 6, in the memory cell MC, positions of the selection layer 420 and the phase-change material layer 410 may be changed. For example, in the memory cell MC, the phase-change material layer 410 may be electrically connected to the first electrode, and the selection layer 420 may be electrically connected to the second electrode 440.

The phase-change material layer 410 may store information. A resistance value of the phase-change material layer 410 may vary according to an applied voltage. The memory device 400 may also store and erase digital information, such as '0' or '1', according to a resistance change of the phase-change material layer 410. For example, the memory device 400 may write data of a high resistance state of the phase-change material layer 410 as '0' and data of a low resistance state as '1'. In this case, a write operation of writing a high resistance state '0' into a low resistance state '1' may be referred to as a 'set operation', and a write operation of writing a low resistance state '1' into a high resistance state '0' may be referred to as a 'reset operation'.

The phase-change material layer 410 may be changed to one of a plurality of resistance states due to an applied electrical pulse. The phase-change material layer 410 may include a phase-change material, in which a crystal state changes according to an amount of current. For example, the phase-change material may be changed into an amorphous state having a relatively high resistance or a crystal state having a relatively low resistance. The phase of the phase-change material may be reversibly changed by Joule's heat generated by a voltage applied to both ends of a memory element, and data may be stored in the memory device 400 through the phase-change.

The selection layer 420 may control a flow of current to the memory device 400 electrically connected thereto and may select the corresponding memory device 400. The selection layer 420 may include a material resistance of which may change according to a magnitude of a voltage applied to both ends thereof.

The selection layer 420 may have good thermal stability, and thus, may be less damaged or less degraded in a fabricating process of, for example, a semiconductor device. Crystallization temperature of the selection layer 420 may be about 350° C. to about 600° C. For example, the crystallization temperature may be greater than or equal to about 380° C., greater than or equal to about 400° C., less than or equal to about 580° C., and/or less than or equal to about 550° C. In addition, at least some examples the sublimation temperature of the selection layer 420 may be about 250° C. to about 400° C. For example, the sublimation temperature may be equal to or greater than about 280° C., equal to or greater than about 300° C., equal to or less than about 380° C., or equal to or less than about 350° C.

A method of driving the memory device 400 will be briefly described below. In the memory device 400, a voltage may be applied to the phase-change material layer 410 of the memory cell MC via the first electrode and the second electrode 440, and a current may flow.

In addition, any memory cell MC may be addressed by selection of the first electrode and the second electrode 440, and by applying a certain signal between selected first and second electrodes and 440, the memory cell MC may be programmed. In addition, by measuring a current value by using the second electrode 440, information according to the resistance value of the phase-change material layer 410 of the corresponding memory cell MC, e.g., the programmed information, may be read.

According to some embodiments, it may be confirmed that providing a memory device including a phase-change material having a high driving speed and low power consumption, and improved memory capacity is possible.

Although the memory device including the phase-change material is described with reference to the embodiments illustrated in the drawings, this is merely an example, and it will be understood that those of a skill in the art may perform various modifications and other equivalent embodiments may be feasible. Therefore, the disclosed embodiments should be considered from an illustrative point of view rather than a limiting point of view. The scope of rights is indicated in the scope of claims, not in the aforementioned explanation, and all differences within the equivalent scope should be interpreted as being included in the scope of rights.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A memory device comprising:
   a substrate;
   a first memory cell extending in a first direction in parallel with an upper surface of the substrate, the first memory cell including a first selection layer and a first phase-change material layer, which are electrically connected to each other;
   a second memory cell extending in the first direction, the second memory cell including a second selection layer and a second phase-change material layer, which are electrically connected to each other; and
   an insulating layer isolating the first memory cell from the second memory cell in a second direction normal to the upper surface of the substrate such that the first phase-change material layer is physically isolated from the second phase-change material layer by the insulating layer,
   wherein the first phase-change material layer and the second phase-change material layer each comprise at least one first layer including a thermal confinement material and at least one second layer including a phase-change material, and wherein the at least one first layer and the at least one second layer extend in the second direction.

2. The memory device of claim 1, wherein the thermal confinement material comprises $Ti_xTe_{1-x}$ (0.3≤x≤0.7).

3. The memory device of claim 1, wherein the phase-change material comprises at least one of a Ge—Sb—Te (GST) alloy, a doped-GST alloy, an $Sb_yTe_{1-y}$ (0.2≤y≤0.8), or doped-$Sb_yTe_{1-y}$ (0.2≤y≤0.8).

4. The memory device of claim 1, wherein the first phase-change material layer is electrically insulated from the second phase-change material layer by the insulating layer.

5. The memory device of claim 1, wherein for at least one of the first phase-change material layer or the second phase-change material layer the at least one first layer and the at least one second layer comprises a plurality of first layers and a plurality of second layers which alternate in the first direction such that each of the second layers is between two adjacent first layers.

6. The memory device of claim 1, wherein the at least one first layer including the thermal confinement material and the at least one second layer including the phase-change material each independently have a thickness of about 1 nm to about 20 nm in the first direction.

7. The memory device of claim 1, wherein each of the first phase-change material layer and the second phase-change material layer has a total thickness of about 10 nm to about 100 nm in the first direction.

8. The memory device of claim 1, wherein a thickness of the insulating layer is about 5 nm to about 50 nm in the second direction.

9. The memory device of claim 1, wherein at least one of the first memory cell or the second memory cell further comprises a heating electrode between the first or second selection layer and the corresponding first or second phase-change material layer.

10. The memory device of claim 1, wherein at least one of the first selection layer or the second selection layer comprises a material having an ovonic threshold switching characteristic.

11. The memory device of claim 10, wherein the at least one of the first selection layer or the second selection layer comprises at least one first element selected from germanium (Ge) and tin (Sn),
at least one second element selected from arsenic (As), antimony (Sb), and bismuth (Bi), and
at least one third element selected from sulfur (S), selenium (Se), and tellurium (Te).

12. The memory device of claim 1, further comprising:
a first electrode electrically connected to one of the first selection layer and the second selection layer.

13. The memory device of claim 1, further comprising:
a second electrode electrically connected to the first phase-change material layer and the second phase-change material layer, the second electrode extending in the second direction.

14. The memory device of claim 13, wherein the first memory cell and the second memory cell share the second electrode as a common electrode.

15. A memory device comprising:
a substrate;
a first insulating layer and a second insulating layer spaced apart from each other in a second direction normal to an upper surface of the substrate; and
at least one memory cell between the first insulating layer and the second insulating layer, the at least one memory cell comprising a selection layer and a phase-change material layer, which are electrically connected to each other in a first direction parallel to the upper surface of the substrate,
wherein the selection layer includes a recess portion and covers surfaces of the first insulating layer and the second insulating layer,
wherein the phase-change material layer comprises at least one first layer including a thermal confinement material; and at least one second layer including a phase-change material, and
wherein the phase-change material layer covers at least of a portion of the first insulating layer, the selection layer, and the second insulating layer along the recess portion such that a length of a surface of the phase-change material layer adjacent to the first insulating layer is greater than a length of a surface of the phase-change material layer adjacent to the selection layer.

16. The memory device of claim 15, wherein the thermal confinement material comprises $Ti_xTe_{1-x}$ (0.3≤x≤0.7).

17. The memory device of claim 15, wherein the phase-change material comprises at least one of a Ge—Sb—Te (GST) alloy, a doped-GST alloy, an $Sb_yTe_{1-y}$ (0.2≤y≤0.8), or doped-$Sb_yTe_{1-y}$ (0.2≤y≤0.8).

18. The memory device of claim 15, wherein the at least one first layer and the at least one second layer include a plurality of first layers and a plurality of second layers which alternate in the first direction such that each of the second layers is between two adjacent first layers.

19. The memory device of claim 15, wherein, in the phase-change material layer, the length of the surface adjacent to the first insulating layer is greater than about 1.0 times and less than or equal to about 5.0 times the length of the surface adjacent to the selection layer.

20. The memory device of claim 15, wherein, in the phase-change material layer, the length of the surface adjacent to the first insulating layer includes lengths of an upper surface, sidewalls, and a lower surface of the phase-change material layer, and the length of the surface adjacent to the selection layer is equal to a length of a sidewall of the selection layer.

21. The memory device of claim 15, wherein each of the at least one first layer and the at least one second layer independently has a thickness of about 1 nm to about 20 nm in the first direction.

22. The memory device of claim 15, wherein the phase-change material layer has a total thickness of about 10 nm to about 100 nm in the first direction.

23. The memory device of claim 15, wherein each of the first insulating layer and the second insulating layer has a thickness of about 5 nm to about 50 nm in the second direction.

24. The memory device of claim 15, wherein the selection layer comprises a material having an ovonic threshold switching characteristic.

25. The memory device of claim 15, further comprising:
a first electrode electrically connected to the selection layer; and
a second electrode electrically connected to the phase-change material layer.

26. The memory device of claim 25, comprising a plurality of memory cells,
wherein the plurality of memory cells share the second electrode as a common electrode.

* * * * *